United States Patent
Usui et al.

(10) Patent No.: US 7,683,268 B2
(45) Date of Patent: Mar. 23, 2010

(54) SEMICONDUCTOR MODULE WITH HIGH PROCESS ACCURACY, MANUFACTURING METHOD THEREOF, AND SEMICONDUCTOR DEVICE THEREWITH

(75) Inventors: Ryosuke Usui, Ichinomiya (JP); Takeshi Nakamura, Isesaki (JP); Atsuhiro Nishida, Ogaki (JP)

(73) Assignee: Sanyo Electric Co., Ltd., Osaka (JP)

( * ) Notice: Subject to any disclaimer, the term of this patent is extended or adjusted under 35 U.S.C. 154(b) by 20 days.

(21) Appl. No.: 11/147,778

(22) Filed: Jun. 7, 2005

(65) Prior Publication Data

US 2005/0269128 A1    Dec. 8, 2005

(30) Foreign Application Priority Data

Jun. 8, 2004    (JP) ............................. 2004-169600

(51) Int. Cl.
    *H01L 23/28* (2006.01)
(52) U.S. Cl. .................. 174/524; 257/702; 257/732
(58) Field of Classification Search .................. 174/250, 174/524; 361/761, 764; 257/737, 738, 702
    See application file for complete search history.

(56) References Cited

U.S. PATENT DOCUMENTS 6,607,937 B1 *  8/2003  Corisis .................... 438/108

| | | | |
|---|---|---|---|
| 2001/0026010 A1 | 10/2001 | Horiuchi et al. | |
| 2005/0146051 A1* | 7/2005 | Jobetto | ................. 257/780 |
| 2005/0157477 A1* | 7/2005 | Kuramochi et al. | ......... 361/761 |

FOREIGN PATENT DOCUMENTS

| JP | H08-162486 | 6/1996 |
|---|---|---|
| JP | 2000-323645 | 11/2000 |
| JP | 2001-254002 A | 9/2001 |
| JP | 2002-110717 | 4/2002 |
| JP | 2002-167435 | 6/2002 |
| JP | 2002-246501 | 8/2002 |
| JP | 2002-348441 | 12/2002 |
| JP | 2004-064082 | 2/2004 |

* cited by examiner

*Primary Examiner*—Hung V Ngo
(74) *Attorney, Agent, or Firm*—Fish & Richardson P.C.

(57) ABSTRACT

A semiconductor element and a passive element are embedded in an insulating resin film by thermocompression bonding. After formation of a interconnection, a layered film which contains a film insulating between elements and is provided with a recess or penetrated portion is pressure-bonded followed by formation of a member with a high resistance or a high dielectric constant by embedding a material of a member constituting an element such as a resistor and a capacitor in the recess. Furthermore, after formation of the upper layer insulating resin film, a photoimageable solder resist layer containing the cardo type polymer is formed, and interconnection formation and solder electrode formation are performed.

11 Claims, 4 Drawing Sheets

FIG.1

PRIOR ART

SEMICONDUCTOR MODULE WITH HIGH PROCESS ACCURACY, MANUFACTURING METHOD THEREOF, AND SEMICONDUCTOR DEVICE THEREWITH

BACKGROUND OF THE INVENTION

1. Field of the Invention

The present invention relates to a semiconductor module provided with a circuit element, a manufacturing method thereof, and a semiconductor device therewith.

2. Description of the Related Art

With an accelerated advance in higher function portable electronics devices such as portable telephones, PDAs, DVCs and DSCs, in order that such products may be accepted by the market, smaller size and lighter weight are indispensable; accordingly, in order to realize this, highly integrated system LSIs are in demand. On the other hand, on such electronics devices, more easy-to-use and convenient ones are demanded; accordingly, on LSIs that are used in devices, higher function and higher performance are demanded. Accordingly, as an LSI chip is highly integrated, the number of I/O increases on the one hand; on the other hand a demand on miniaturization of a package itself is strong. In order to combine these, a development of a semiconductor package suitable for dense substrate mounting of semiconductor elements is strong in demand. In order to cope with such demands, a packaging technology called a CSP (Chip Size Package) is variously developed.

As an example of such a package, a BGA (Ball Grid Array) is known. The BGA is formed by mounting a semiconductor chip on a packaging substrate, followed by applying resin molding thereto, further followed by forming solder balls in area on an opposite surface as external terminals. In the BGA, a mounting area is achieved in area; accordingly, a package can be relatively easily miniaturized. Furthermore, there is no need of coping with the narrow pitch on a circuit board side and precise mounting technology becomes unnecessary; accordingly, when the BGA is used, even in the case where the package cost is a little bit higher, the mounting cost can be reduced as a whole.

Figure 1:
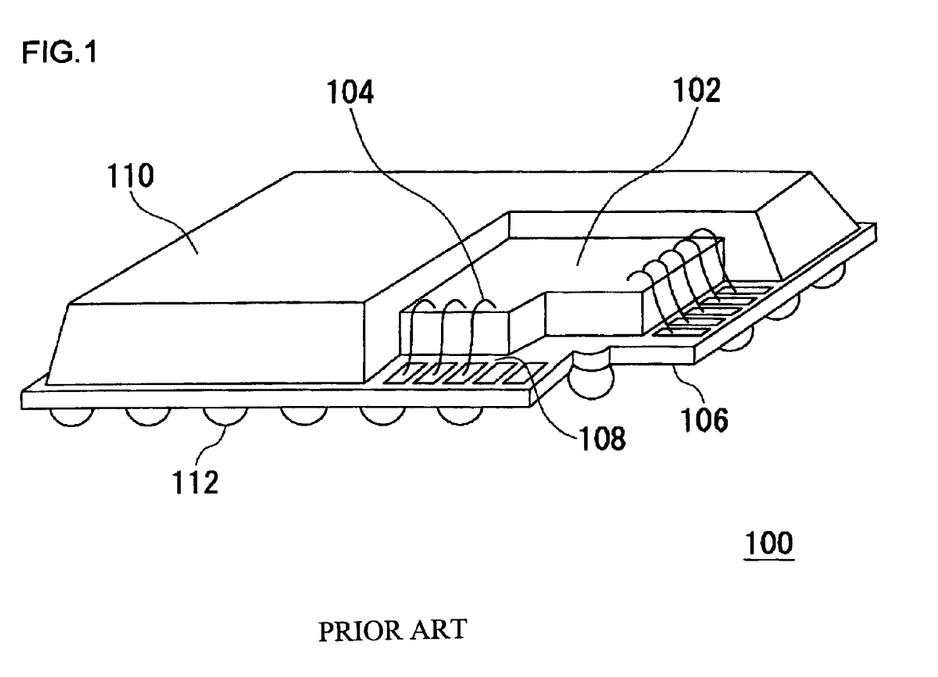
FIG. 1 is a diagram showing a schematic configuration of a general BGA.

FIG. 1 is a diagram showing a schematic configuration of a general BGA. A BGA 100 has a structure in which on a glass epoxy substrate 106, an LSI chip 102 is mounted through an adhesive layer 108. The LSI chip 102 is molded with a sealing resin 110. The LSI chip 102 and the glass epoxy substrate 106 are electrically connected with metal wires 104. On a back face of the glass epoxy substrate 106, solder balls 112 are arranged in array. Through the solder balls 112, the BGA 100 is mounted on a printed circuit board.

In such a package, when a semiconductor chip is sealed, for instance, transfer molding, injection molding, potting, dipping or the like is used (for instance, refer to Japanese Laid-Open Patent Application 08-162486).

However, in the existing CSPs such as disclosed in Japanese Laid-Open Patent Application 08-162486, smaller size, smaller thickness and lighter weight to an extent that is desired at present in the portable electronics devices cannot be realized.

Related Art list
JPA laid open H08-162486
JPA laid open 2002-110717

SUMMARY OF THE INVENTION

The present invention was achieved in view of the above-mentioned situations and intends to provide a technology that allows making a semiconductor module smaller and thinner.

According to the present invention, a semiconductor module includes a insulating resin film, a plurality of circuit elements embedded in the insulating resin film, and a solder resist layer which is provided upper than the insulating resin film, wherein the plurality of circuit elements are bonded to the insulating resin film, and the solder resist layer contains a cardo type polymer. It is preferable to perform pressure bonding for the bonding of the circuit elements, and it is more preferable to perform thermocompression bonding. The circuit element may be a semiconductor element and a passive element.

According to the invention, when the solder resist layer contains the cardo type polymer, the characteristics such as resolution and humidity absorption properties can be improved in the solder resist layer. Further, the thickness reduction can be also achieved in the solder resist layer.

The semiconductor module according to the invention may have a structure where one surface at an upper portion of any one of at least one member constituting partially or wholly the circuit element and one surface at an upper portion of the insulating film between the circuit elements form a same plane, and one surface at a lower portion of any one of the at least one member and one surface at a lower portion of the insulating film between the circuit elements form a same plane.

That one surface at an upper portion of any one of members and one surface at an upper portion of the insulating film between the circuit elements form a same plane means that one surface at an upper portion of the member and one surface at an upper portion of the insulating film between elements form a substantially same flat plane.

Furthermore, that one surface at a lower portion of any one of members and one surface at a lower portion of the insulating film between the circuit elements form a same plane means that one surface at a lower portion of the member and one surface at a lower portion of the insulating film between the circuit elements form a substantially same flat plane.

According to the present invention, a manufacturing method of a semiconductor module includes embedding a circuit element in an insulating resin film by arranging a layered product consisting of the insulating resin film and a conductive film on the circuit element which is fixed, fixing the circuit element in the insulating resin film by pressure bonding, and forming a solder resist layer upper than the insulating resin film in which the circuit element is embedded, wherein the solder resist layer contains a cardo type polymer.

In the above, constitutions of the invention were explained; however, any combinations thereof are effective as well as embodiments according to the present invention. Furthermore, ones in which expressions of the invention are transformed into other category are also effective as embodiments of the invention.

DETAILED DESCRIPTION OF THE INVENTION

FIGS. 2A through 2E are sectional diagrams showing a first half of a manufacturing process of a semiconductor module in the present embodiment.

Figure 2A:
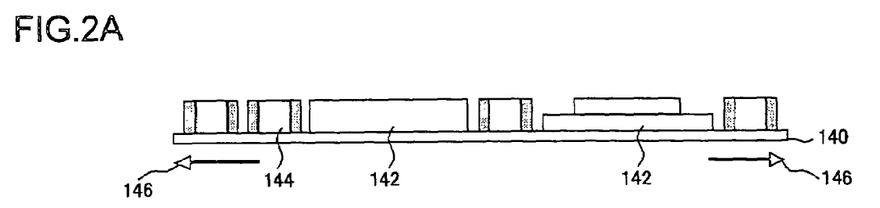
FIGS. 2A through 2E are sectional diagrams showing a first half of a manufacturing process of a semiconductor module in an embodiment of the present invention.

Firstly, as shown in FIG. 2A, circuit elements such as a plurality of semiconductor elements 142 and passive elements 144 are fixed on a substrate 140. Here, the substrate 140 may be a tape substrate that has adhesiveness and can fix the semiconductor elements 142 and the passive elements 144 on a surface thereof. Furthermore, the substrate 140 can be formed of a material that can be peeled from an insulating resin film 122 after the semiconductor elements 142 and the passive elements 144 are embedded in the insulating resin film 122. Furthermore, as the substrate 140, an expandable material can be used. As such a material, for instance, a PET film can be used.

The semiconductor element 142 is, for instance, a transistor, diode, IC chip and so on. The passive element 144 is, for instance, a chip capacitor, chip resistor and so on.

Figure 2B:
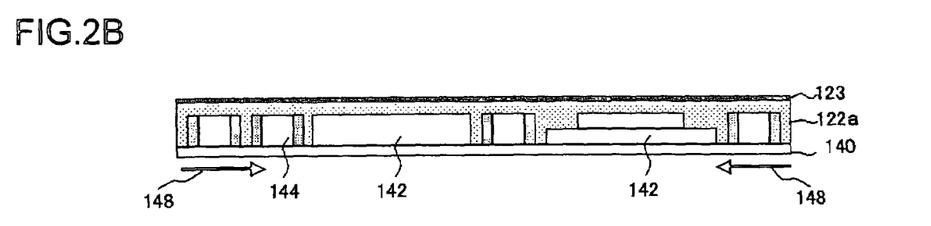

When as the substrate 140 an expandable material is used, as shown in FIG. 2A, after a plurality of semiconductor elements 142 and passive elements 144 are fixed on the substrate 140, the substrate 140 is expanded in a tensile direction 146 in the drawing. An insulating resin film 122a, which is hereinafter referred to as the first insulating resin film, with a conductive film, such as a resin film with copper foil, is then placed on the substrate 140 expanded, followed by vacuum pressing to stuff the semiconductor elements 142 and the passive elements 144 in the first insulating resin film 122a. Subsequently, as shown in FIG. 2B, force that has extended the substrate 140 is relieved in a stress relaxation direction 148 in the drawing to make gaps between chips smaller.

Thereby, the semiconductor elements 142 and the passive elements 144 are embedded inside of the first insulating resin film 122a, and the semiconductor elements 142 and the passive elements 144 are pressure-bonded and adhered to the inside of the first insulating resin film 122a. In the embodiment, when as the substrate 140 an expandable material is used, in a state where the substrate 140 on which the semiconductor elements 142 and the passive elements 144 are fixed is expanded, the semiconductor elements 142 and the passive elements 144 are stuffed inside of the first insulating resin film 122a. Accordingly, when the semiconductor elements 142 and the passive elements 144 are stuffed inside of the first insulating resin film 122a, gaps between elements become wider, resulting in enabling to readily stuff the first insulating resin film 122a between elements. As a result, the adhesiveness between the semiconductor elements 142 or the passive elements 144, and the first insulating resin film 122a can be made excellent.

The conductive film 123 on the first insulating resin film 122a is, for instance, a rolled metal such as a rolled copper foil. As the first insulating resin film 122a, any materials that can be softened by heating can be used. For instance, an epoxy resin, melamine derivative such as a BT resin, liquid crystal polymer, PPE resin, polyimide resin, fluorocarbon resin, phenolic resin, polyamide bismaleimide and so on can be used. When such a material is used, the rigidity of the semiconductor module can be heightened, and thereby the semiconductor module is improved in the stability. When a thermosetting resin such as an epoxy resin, BT resin, PPE resin, polyimide resin, fluorocarbon resin, phenolic resin, and polyamide bismaleimide is used as the first insulating resin film 122a, the rigidity of the semiconductor module can be more heightened.

Epoxy resin may be bisphenol A epoxy resin, bisphenol F epoxy resin, bisphenol S epoxy resin, phenol novolac resin, cresol novolac type epoxide resin, tris phenol methane type epoxide resin, alicyclic epoxy resin and the like.

Melamine derivative may be melamine, melamine cyanurate, methylol melamine, (iso)cyanuric acid, melam, melem, melon, succino gamine, melamine sulfate, acetoguanamine sulfate, melam sulfate, guanyl melamine sulfate, melamine resin, BT resin, cyanuric acid, iso-cyanuric acid, iso-cyanuric acid derivatives, melamine isocyanurate, benzoguanamine, acetoguanamine, or guanidine compounds and the like.

Aromatic system liquid crystalline polyester, polyimide, polyesteramide and resin composites containing these are examples of liquid crystal polymer. The liquid crystalline polyester or the liquid crystalline polyester composite, characterized by excellent balance in heat resistance, workability and moisture absorption, is preferable.

Liquid crystalline polyester may be (1) a product of reaction between aromatic dicarboxylic acid, aromatic diol and aromatic hydroxy carboxylic acid, (2) a product of reaction between a combination of aromatic hydroxy carboxylic acids, (3) a product of reaction between aromatic dicarboxylic acid and aromatic diol, (4) a product of reaction between polyester such as polyethylene terephthalate and aromatic hydroxy carboxylic acid, or the like. In place of aromatic dicarboxylic acid, aromatic diol and aromatic hydroxy carboxylic acid, ester derivatives of these may be used. Aromatic dicarboxylic acid, aromatic diol and aromatic hydroxy carboxylic acid may have their aromatic part replaced by halogen atoms, alkyl groups or aryl groups.

Examples of a repeated structural unit of the liquid crystalline polyester are a repeated structural unit derived from aromatic dicarboxylic acid (formula (i) below), a repeated structural unit derived from aromatic diol (formula (ii) below), and a repeated structural unit derived from aromatic hydroxy carboxylic acid (formula (iii) below):

—CO-A1-CO— (i)

where A1 indicates a divalent ligand containing an aromatic ring,

—O-A2-O— (ii)

where A2 indicates a divalent ligand containing an aromatic ring, and

—CO-A3-O— (iii)

where A3 indicates a divalent ligand containing an aromatic ring.

Furthermore, in the first insulating resin film 122a, a packing material such as filler or fibers can be contained. As the filler, for instance, particulate or fibrous $SiO_2$ and Silicon Nitride can be used. When the filler or fibers are contained in the first insulating resin film 122a, when, after the first insulating resin film 122a is heated for thermocompression-bonding with the semiconductor elements 142 and the passive elements 144, the first insulating resin film 122a is cooled to for instance room temperature, the first insulating resin film 122a is less warped. Thereby, the adhesiveness between the semiconductor elements 142 or the passive elements 144 and the first insulating resin film 122a can be heightened. Still furthermore, when the fibers are contained in the first insulating resin film 122a, the flowability of the first insulating resin film 122a can be improved; accordingly, the adhesiveness between the semiconductor elements 142 or the passive elements 144 and the first insulating resin film 122a can be heightened. From these viewpoints, when aramid non-woven fabric is preferably used as a material that constitutes the first insulating resin film 122a. The workability can be made more excellent thereby.

Para-aramid fiber or meta-aramid fiber may be used as aramid fiber. For instance, poly (p-phenylene terephthalamide) (PPD-T) may be used as the para-aramid fiber, and poly (m-phenylene isophthalamide) (MPD-I) may be used as the meta-aramid fiber.

The content of the packing material contained in the first insulating resin film 122a can be set depending on the materials constituting the first insulating resin film 122a. For instance, it may be no more than 50% by weight. The adhesiveness between the semiconductor elements 142 or the passive elements 144 and the first insulating resin film 122a can be heightened thereby.

As the insulating resin film with the conductive film, one obtained by adhering a conductive film 123 on the first film-like insulating resin film 122a can be used. Furthermore, the insulating resin film with the conductive film can be formed as well by coating a resin composition that constitutes the first insulating resin film 122a on the conductive film 123, and drying it. In the embodiment, the resin composition, in the range that does not contradict the object of the invention, may contain a hardener, hardening accelerator or other components. The insulating resin film with the conductive film is placed on the substrate 140 in a state where the first insulating resin film 122a is in B stage (this means a state where a resin is primary cured, half-cured or temporarily cured state).

By implementing thus, the adhesiveness between the first insulating resin film 122a and the semiconductor elements 142 or the passive elements 144 can be improved. Thereafter, depending on a kind of the resin that constitutes the first insulating resin film 122a, the first insulating resin film 122a is heated followed by pressure bonding under vacuum or a reduced pressure of the insulating resin film with conductive film, and the semiconductor elements 142 and the passive elements 144. Furthermore, in another example, when the first film-like insulating resin film 122a, with it maintained in a B stage, is placed on a substrate 140, the conductive film 123 is further placed thereon, so that the conductive film 123 is thermocompression-bonded to the first insulating resin film 122a when the first insulating resin film 122a is thermocompression-bonded to the semiconductor elements 142 and the passive elements 144, and thereby as well the insulating resin film with the conductive film can be formed.

Figure 2C:
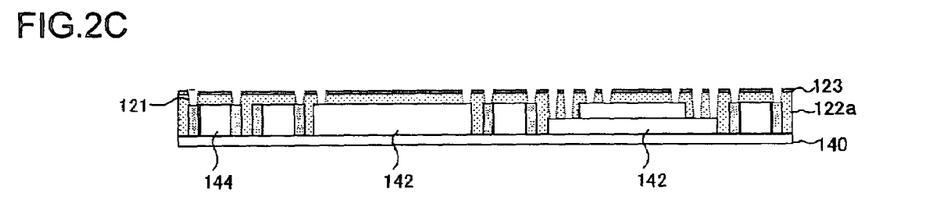

Then, the conductive film 123 is subjected to a interconnection patterning process where an interconnection is formed by laser drawing (trepanning alignment) or wet copper etching. After that, as shown in FIG. 2C, a via hole (through hole) is formed in the first insulating resin film 122a by use of a combination of a $CO_2$ laser, YAG laser and dry etching.

Figure 2D:
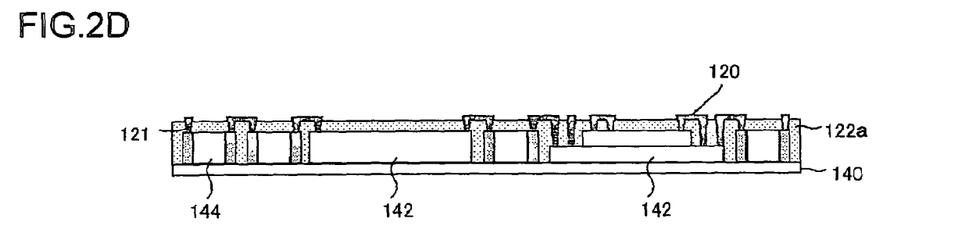

Subsequently, as shown in FIG. 2D, by use of the electroless copper plating or electrolytic copper plating compatible with a high aspect ratio, a conductive film 120 is formed and a conductive material is embedded in the through hole to form a via 121. In the next place, the conductive film 120 is patterned by means of the semi-additive plating to form a high density interconnection, followed by performing a interconnection formation process in which a plurality of semiconductor elements 142 and passive elements 144 are electrically connected.

Figure 2E:
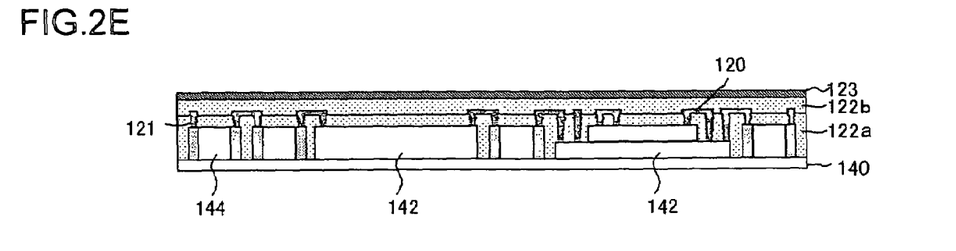

Then, as shown in FIG. 2E, the second insulating resin film formation process is performed to further form the second insulating resin film 122b with a conductive film 123.

A material that constitutes the second insulating resin film 122b can be appropriately selected from, for instance, an epoxy resin, melamine derivative such as a BT resin, liquid crystal polymer, PPE resin, polyimide resin, fluorocarbon resin, phenolic resin, polyamide bismaleimide and so on that were explained in the first insulating resin film 122a.

The conductive film 123 that is further formed on the second insulating resin film 122b may be a rolled metal such as a rolled copper foil.

Now, for instance, the first insulating resin film 122a can be formed of a material that is more readily softened than a material constituting the second insulating resin film 122b. Thereby, during the thermocompression bonding, the first insulating resin film 122a is easier to deform than the second insulating resin film 122b; accordingly, the semiconductor elements 142 and the passive elements 144 are smoothly pushed in the first insulating resin film 122a while the second insulating resin film maintains the rigidity to inhibit the insulating resin film 122 as a whole from deforming. The first insulating resin film 122a and the second insulating resin film 122b are hereinafter also collectively referred to as an insulating resin film 122.

Furthermore, the first insulating resin film 122a can be formed of a material lower in the glass transition temperature than a material that constitutes the second insulating resin film 122b. Still furthermore, in another example, the first insulating resin film 122a can be constituted of a material higher in the adhesiveness with the semiconductor elements 142 and the passive elements 144 than a material that constitutes the second insulating resin film 122b. By thus implementing as well, an effect same as that mentioned above can be obtained.

Still furthermore, in the first and second insulating resin films, 122a and 122b, a packing material such as filler or fibers can be contained. In this case, a content of the packing material in the first insulating resin film 122a can be smaller than that of the packing material in the second insulating resin film 122b. A configuration in which the packing material is contained only in the second insulating resin film 122b and not contained in the first insulating resin film 122a can be adopted. By thus implementing, the flexibility of the first insulating resin film 122a is heightened to enable to readily embed the semiconductor elements 142 and the passive elements 144 while the insulating resin film 122 can be reduced in warp owing to the second insulating resin film 122b.

As mentioned above, when the first and second insulating resin films, 122a and 122b, are constituted of suitable materials depending on the respective objects, the semiconductor elements 142 and the passive elements 144 can be excellently embedded in the insulating resin film 122, while the rigidity of the semiconductor module can be heightened and the moldability can be improved.

FIGS. 3F through 3K are sectional views showing a second half of a manufacturing process of a semiconductor module in the embodiment of the invention.

Figure 3F:
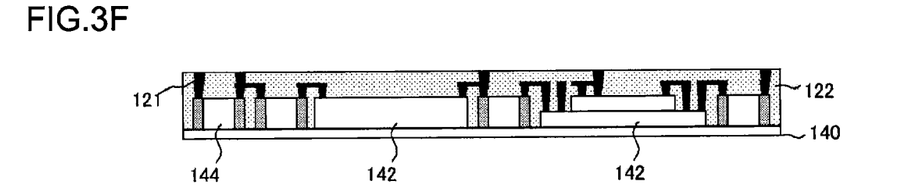
FIGS. 3F through 3K are sectional diagrams showing a second half of a manufacturing process of a semiconductor module in an embodiment of the invention.

Firstly, as shown in FIG. 3F, the second insulating resin film 122b and the conductive film 123 thereon are, similarly to the above, subjected to a interconnection patterning process, via hole formation process, plating process and interconnection formation process to perform a two-layer interconnect formation process.

As will be described below, when an interconnection 125 and a conductive film 124 are beforehand formed on a layered film 160 that is further stacked on the second insulating resin film 122b, there is no need of forming a interconnection on a surface of the second insulating resin film 122b.

Figure 3G:
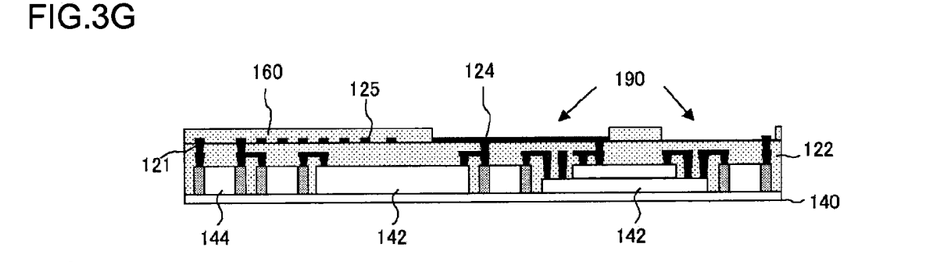

In the next place, as shown in FIG. 3G, a layered film 160 provided with a recess 190 is stacked on the second insulating resin film 122b, to perform a function layer formation first process. Since the layered film 160 is beforehand provided with a recess indented or a portion penetrated through by means of laser processing or press processing, after bonding to the second insulating resin film 122b by the pressure bonding or the like, the recess 190 is formed. The recess 190 may be a bottomed cavity-like recess having an opening only in an upward direction of the layered film 160 or a recess that is formed of a tunnel-like penetrated portion opened at both surfaces of the layered film 160 and the top surface of the second insulating resin film 122b. The layered film 160 can be stacked by vacuum adhesion method or reduced-pressure adhesion method.

The recess 190 may be formed by patterning or etching after the layered film 160 is formed on the insulating resin film 122.

The layered film 160 may be an insulating resin film. An insulating resin film that can be used in the layered film 160 may be properly selected from, for instance, an epoxy resin, melamine derivative such as a BT resin, liquid crystal polymer, PPE resin, polyimide resin, fluorocarbon resin, phenolic resin, polyamide bismaleimide and so on that were explained in the abovementioned insulating resin film 122. When such a material is used, an interconnection 125 and a conductive film 124 described later can be preferably insulated from other conductive members. Furthermore, such materials are easy in processing a recess or stacking owing to vacuum adhesion.

Furthermore, in the layered film 160, an interconnection 125 and a conductive film 124 may be formed beforehand. As the interconnection 125 and the conductive film 124, a rolled metal such as a rolled copper foil may be processed and used.

Figure 3H:
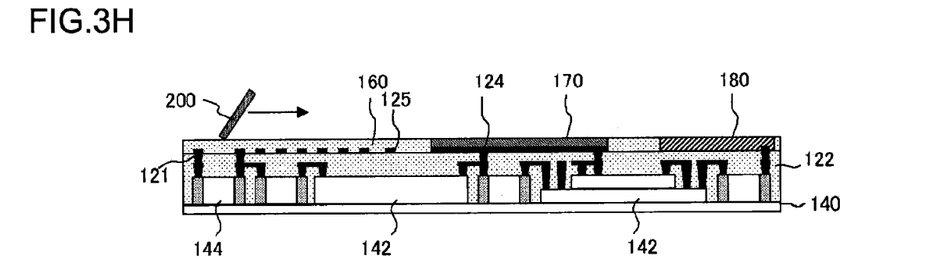

Subsequently, as shown in FIG. 3H, a functional layer formation second process including embedding a pasty embedding material in the recess 190 formed in the layered film 160; and drying the embedding material to form an embedding member that partially or wholly constitutes a circuit element such as a high dielectric constant member 170 that constitutes a resistor 180 and a capacitor described later is performed.

Here, the embedding member that partially or wholly constitutes the circuit element can be made a member that constitutes a passive element and so on. For instance, the embedding member may be a member that partially or wholly constitutes a passive element such as the resistor 180 and the capacitor described later. When the embedding member is a member that partially or wholly constitutes the resistor 180, the embedding material that is a material of the embedding member is not particularly restricted as far as it is a material that has a high resistance, and may be a material including, for instance, carbon or metals such as Ni—Cr (nichrome).

Furthermore, when the embedding member is a high dielectric constant member 170 that constitutes the capacitor described later, a material of the embedding member is not particularly restricted as far as it is a material that has a high dielectric constant, and may be a material including a carbon-base material such as activated carbon that has a large specific surface area or tantalum pentoxide, for instance.

Lower and upper electrodes of the capacitor may be formed of metal having the conductivity. For instance, a thin film electrode made of copper, aluminum or the like can be used.

Furthermore, the embedding material may be a pasty material in which powdery solid is suspended in a solvent, and it may be embedded in the recess 190 by means of a squeegeeing means 200 such as a squeegee. Alternatively, the embedding material may be embedded by means of a screen method. Here, the screen method is a kind of mimeograph method and means a printing method in which a screen made of a chemical fiber such as silk, Tetron and Nylon or a metal fiber is utilized as a plate. As a procedure of implementing the screen method, firstly, a screen is extended on a frame, four corners thereof are stretched and tightened to fix, and according to a mechanical or optical engineering (photographic) method a plate film (resist) is formed thereon, so as to clog openings other than necessary image lines to prepare a plate. In the next place, an embedding material is charged in the frame, with squeegeeing means 200 made of, for example, a spatula-like rubber plate called squeegee, an internal surface of the screen is pressed and moved. Thereby, the embedding material going through a portion of the screen where the plate film is not present, is pressed against the inside of the recess 190 of the layered film 160 that is placed below the plate as a substance to be printed, and embedded inside of the recess without leaving a gap. Additionally, the embedding material remaining outside of the recess 190 may be removed by use of the squeegeeing means 200 such as a squeegee.

Figure 3I:
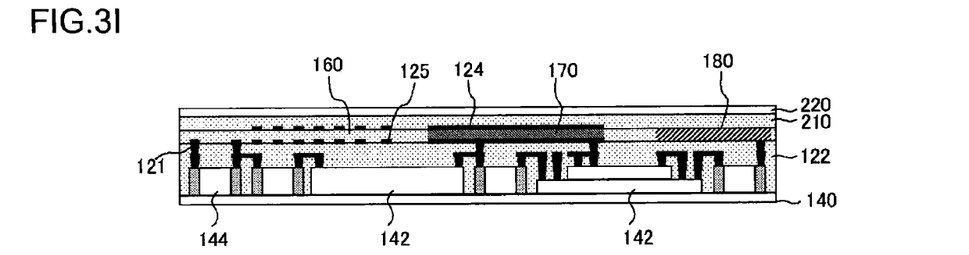

As shown in FIG. 3I, after forming an upper layer insulating resin film 210 on the layered film and constituent members of the circuit device, the photoimageable solder resist layer 220 is pressure-bonded onto the top surfaces. With reference to the pressure bonding conditions, for example, the temperature is set to 110° C., the time is set in the range from 1 to 2 minutes, and the pressure is set to about 2 atmospheres. Then, the photoimageable solder resist layer 220 is partially cured by after-baking process.

For example, it is possible that a cardo type polymer contained resin film described later are used as the photoimageable solder resist layer 220.

Figure 3J:
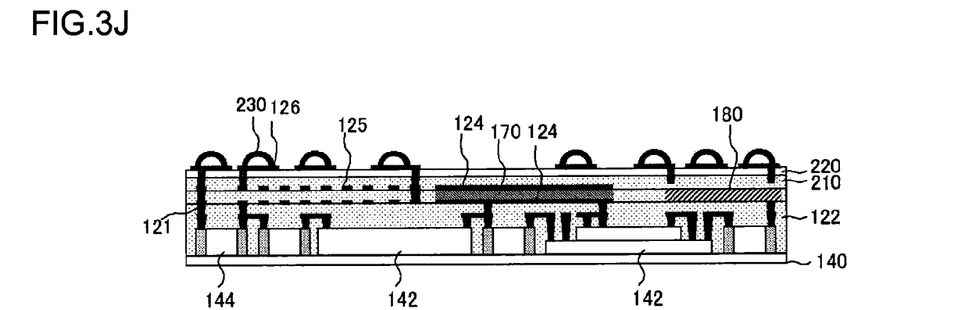

Subsequently, as shown in FIG. 3J, after a via hole is formed by patterning by exposure using a glass as the mask and chemical-etching using the photoimageable solder resist layer 220 as the mask, plating process and the interconnection formation process are performed as a three-layer interconnect formation process. Then, on a conductive film 126 formed at an upper portion of the uppermost layer, a solder electrode formation process is applied to form solder electrodes (solder balls) 230 as a back surface electrode by a solder print method and so on.

The effect that the cardo type polymer contained resin film is used for the photoimageable solder resist layer 220 in the present embodiment will be described below.

The cardo type polymer is a general term for the polymer having the structure in which a cyclic group is directly bonded to the polymer main chain as shown in Chemical Formula I. Where $R_1$ and $R_2$ express the bivalent groups such as the alkylene group and the group containing the aromatic ring.

(Chemical Formula I)

(CHEMICAL FORMULA I)

Namely, the cardo type polymer shall mean the polymer having the structure in which the bulky substituent group containing the quaternary carbon atom is substantially perpendicular to the main chain.

It is possible that cyclic portion includes either a saturated bond or the unsaturated bond. In addition to the carbon atom, it is possible that cyclic portion includes atoms such as the nitrogen atom, the oxygen atom, the sulfur atom, and the phosphorus atom. It is possible that the cyclic portion is formed in the polycycle or the fused ring. It is possible that the cyclic portion is bonded to other carbon chains and further cross-linked.

As shown in Chemical Formula I, the cyclic group such as a fluorenyl group which includes the fused ring having the structure, in which six-membered rings are bonded to both sides of a five-membered ring and the remaining one carbon atom of the five-membered ring is bonded to the main chain, can be cited as an example of the bulky substituent group.

As shown in Chemical Formula II, the fluorenyl group is one in which the 9-position carbon atom of fluolene is dehydrogenized. In the cardo type polymer, as shown in Chemical Formula I, the fluorenyl group is bonded to the carbon atom of the alkyl group which is of the main chain at the position of the dehydrogenized carbon atom.

(Chemical Formula II)

(CHEMICAL FORMULA II)

Since the cardo type polymer is one which has the above structure, the cardo type polymer has the following effects:
(1) Rotation constraint of polymer main chain.
(2) Conformation control of main chain and side chain.
(3) Packing obstruction between molecules.
(4) Increase in aromaticity by introducing aromatic substituent group to side chain.

Accordingly, the cardo type polymer has the advantages such as the high mechanical strength, high heat-resistant properties, solvent solubility, high transparency, high refractive index, low birefringence, and higher gas permeability.

The cardo type polymer contained resin film used for the photoimageable solder resist layer 220 can be formed in a thin film while voids and unevenness are prevented from producing by using a predetermined additive. Therefore, the film having a thickness of about 25 µm can be used as the photoimageable solder resist layer 220. The thickness of the film becomes about half, when compared with the conventional resin material, which is used for the photoimageable solder resist layer 220, having a thickness of about 50 µm. Accordingly, the semiconductor module of the present embodiment can be miniaturized by using a cardo type polymer contained resin film as the photoimageable solder resist layer 220.

As mentioned later, the cardo type polymer contained resin film has an excellent moisture resistance and adhesion properties. Therefore, the adhesion properties with a device mounted on the surface of the semiconductor module or other layers can be improved by using the cardo type polymer as the photoimageable solder resist layer 220.

As mentioned later, the cardo type polymer contained resin film has the excellent resolution. Since the thickness of the film used in the present embodiment becomes about half when compared with the conventional resin material used in the photoimageable solder resist layer, the photoimageable solder resist layer 220 in which the cardo type polymer contained resin film is used has the further excellent resolution, which allows dimensional accuracy to be improved in making a via hole. Therefore, the reliability can be improved in the semiconductor module.

As mentioned later, the cardo type polymer contained resin film has excellent dielectric characteristics. Therefore, the parasitic capacitance between pieces of interconnection embedded in the photoimageable solder resist layer 220 can be reduced by using the cardo type polymer contained resin film as the photoimageable solder resist layer 220, which allows the reliability to be improved in the semiconductor module.

Since the cardo type polymer contained resin film has a high mechanical strength, even if the thickness of the photoimageable solder resist layer 220 is thinned to about half compared with the conventional resin material, the mechanical strength can be kept and the warp of the whole of semiconductor module can be suppressed. Accordingly, bonding accuracy of the device mounted on the semiconductor module can be improved.

A spin coating method usually used for forming the photoimageable solder resist layer still has room for improvement in that the voids are easily produced in outer periphery of the photoimageable solder resist layer. A potting method still has room for improvement in that the voids are easily produced after application because an adhesive is in a liquid state before bonding. On the contrary, in the present embodiment, the voids and the unevenness are hardly produced in the photoimageable solder resist layer 220 of the semiconductor module to which the film is pressure-bonded, because the voids and the unevenness are suppressed during the pressure bonding of the film. Therefore, the reliability and the production stability of the semiconductor module can be improved.

It is also possible that the cardo type polymer is one which is formed of the cross-linked polymer having the carboxylic group and the acrylate group in the same molecular chain. Conventionally, a blend of a carboxyl group oligomer having development properties and a polyfunctional acryl is used as the general photosensitive varnish. However, the general photosensitive varnish still has room for improvement in the resolution. When the cardo type polymer formed of the cross-linked polymer having the carboxyl group and the acrylate group in the same molecular chain is used instead of the general photosensitive varnish, the cardo type polymer has the carboxyl group having the development properties and the acrylate group which is of the crosslinking group in the same molecular chain, and the cardo type polymer also has the bulky substituent group in the main chain, so that the radical diffusion is difficult to occur. Therefore, in the cardo type polymer contained photoimageable solder resist film, there is the advantage that the resolution is improved.

It is desirable that the cardo type polymer contained resin film satisfies the following physical properties. The following physical properties are the value for the resin portion which does not include the filler and the like, and the physical properties can be appropriately adjusted by adding the filler and the like.

In the cardo type polymer contained resin film, it is preferable that the glass transition temperature (Tg) is e.g. not lower than 180° C., and it is more preferable that Tg is not lower than 190° C. When Tg exists in the above range, the heat-resistant properties are improved in the cardo type polymer contained resin film.

In the cardo type polymer contained resin film, it is preferable that Tg is e.g. not more than 220° C., it is more preferable that Tg is not more than 210° C. When Tg exists in the above range, the cardo type polymer contained resin film can stably be produced by the usual manufacturing method. Tg can be measured by dynamic viscoelasticity measurement (DMA).

In the range of not more than Tg of the cardo type polymer contained resin film, it is preferable that the linear expansion coefficient (CTE) of the cardo type polymer contained resin film is e.g. not more than 80 ppm/° C., and it is more preferable that CTE is not more than 75 ppm/° C. When CTE exists in the above range, the adhesion properties between the cardo type polymer contained resin film and other members are improved.

In the range of not more than Tg of the cardo type polymer contained resin film, it is preferable that CTE of the cardo type polymer contained resin film is e.g. not lower than 50 ppm/° C., and it is more preferable that CTE is not lower than 55 ppm/° C. Further, the resin composition having CTE of not more than 20 ppm/° C. can be obtained by mixing the filler in the cardo type polymer contained resin film. When CTE exists in the above range, the cardo type polymer contained resin film can stably be produced by the usual manufacturing method. CTE can be measured according to the thermal expression measurement by a thermo-mechanical analysis apparatus (TMA).

It is preferable that heat conductivity of the cardo type polymer contained resin film is e.g. not more than 0.50 W/cm$^2$·sec, and it is more preferable that the heat conductivity is not more than 0.35 W/cm$^2$·sec. When the heat conductivity exists in the above range, the heat-resistant properties are improved in the cardo type polymer contained resin film.

It is preferable that the heat conductivity of the cardo type polymer contained resin film is e.g. not lower than 0.10 W/cm$^2$·sec, and it is more preferable that the heat conductivity is not lower than 0.25 W/cm$^2$·sec. When the heat conductivity exists in the above range, the cardo type polymer contained resin film can stably be produced by the usual manufacturing method. For example, the heat conductivity can be measured by a disk heat flow meter method (ASTM E1530).

In the via portion which has the diameter ranging from 10 to 100 μm in the cardo type polymer contained resin film, it is preferable that a via aspect ratio is e.g. not lower than 0.5, and it is more preferable that the via aspect ratio is not lower than 1. When the via aspect ratio exists in the above range, the resolution is improved in the cardo type polymer contained resin film.

In the via portion which has the diameter ranging from 10 to 100 μm in the cardo type polymer contained resin film, it is preferable that the via aspect ratio is e.g. not more than 5, and it is more preferable that the via aspect ratio is not more than 2. When the via aspect ratio exists in the above range, the cardo type polymer contained resin film can stably be produced by the conventional manufacturing method.

In the case where an alternating electric field having the frequency of 1 MHz is applied to the cardo type polymer contained resin film, it is preferable that the dielectric constant of the cardo type polymer contained resin film is e.g. not more than 4, and it is more preferable that the dielectric constant is not more than 3. When the dielectric constant exists in the above range, dielectric characteristics such as high-frequency characteristics are improved in the cardo type polymer contained resin film.

In the case where the alternating electric field having the frequency of 1 MHz is applied to the cardo type polymer contained resin film, it is possible that the dielectric constant is e.g. not lower than 0.1, and it is more preferable that the dielectric constant is not lower than 2.7. When the dielectric constant exists in the above range, the cardo type polymer contained resin film can stably be produced by the conventional manufacturing method.

In the case where the alternating electric field having the frequency of 1 MHz is applied to the cardo type polymer contained resin film, it is preferable that a dielectric dissipation factor is e.g. not more than 0.04, and it is more preferable that the dielectric dissipation factor is not more than 0.029. When the dielectric dissipation factor exists in the above range, the dielectric characteristics such as the high-frequency characteristics are improved in the cardo type polymer contained resin film.

In the case where the alternating electric field having the frequency of 1 MHz is applied to the cardo type polymer contained resin film, it is preferable that the dielectric dissipation factor is e.g. not lower than 0.001, and it is more preferable that the dielectric dissipation factor is not lower than 0.027. When the dielectric dissipation factor exists in the above range, the cardo type polymer contained resin film can stably be produced by the conventional manufacturing method.

In the cardo type polymer contained resin film, it is preferable that 24-hour water absorption (wt %) is e.g. not more than 3 wt %, and it is more preferable that the 24-hour water absorption (wt %) is not more than 1.5 wt %. When the 24-hour water absorption exists in the above range, moisture resistance can be improved in the cardo type polymer contained resin film.

In the cardo type polymer contained resin film, it is preferable that 24-hour water absorption (wt %) is e.g. not lower than 0.5 wt %, and it is more preferable that the 24-hour water absorption (wt %) is not lower than 1.3 wt %. When the 24-hour water absorption exists in the above range, the cardo type polymer contained resin film can stably be produced by the conventional manufacturing method.

The characteristics such as the thinning of film, the mechanical strength, the heat-resistant properties, the adhesion properties to other members, the resolution, the dielectric characteristics, and the moisture resistance are required for the photoimageable solder resist layer 220 for which the cardo type polymer contained resin film is used. The characteristics required for the photoimageable solder resist layer 220 are realized in a well-balanced manner, when the cardo type polymer contained resin film satisfies the above physical properties.

In the semiconductor module of the present embodiment, the semiconductor elements 142 and the passive elements 144 are embedded in the resin layer previously, and the insulating resin film with the conductive film is bonded after planarization of the surface with which the insulating resin film with the conductive film is bonded. Furthermore, the embedding material is embedded in the recess 190 of the layered film 160 so that the surface of the upper layer insulating resin film 210 is flat without irregularity caused by elements. As a result, a process with a high dimensional accuracy can be achieved with synergic effect with the photoimageable solder resist layer 220 for which the cardo type polymer contained resin film is used.

Figure 3K:
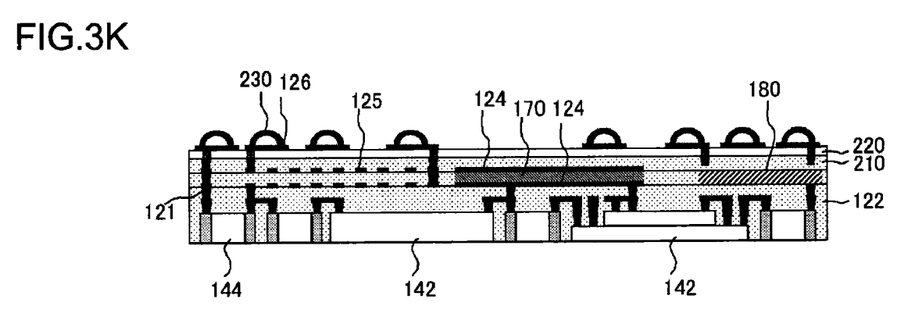

Then, as shown in FIG. 3K, a substrate peeling process is performed to peel the substrate 140 from an insulating resin film 122. While the substrate peeling process may be mechanically performed, UV may be irradiated for peeling to lower the adhesiveness of the substrate 140 by a cross-linking reaction, when the substrate 140 is a UV-reactive film.

Thereby, a structure which has a surface where the semiconductor elements 142 and the passive elements 144 are sealed with the insulating resin film 122, and another surface where the semiconductor elements 142 and the passive elements 144 are exposed can be obtained.

Application to ISB Package

A manufacturing method of a semiconductor module in the present embodiment can be applied to manufacture an ISB (Integrated System in Board; registered trade mark) package. When the method is used, a manufacturing process of the ISB package can be simplified. In what follows, the ISB package will be explained.

The ISB is a unique coreless system in package which is a package of an electronic circuit such as a semiconductor bare chip, and has no core (substrate) for supporting the circuit element even with a copper interconnection pattern. In Japanese Laid-Open Patent Application 2002-110717, such a system in package is described.

Conventionally, an ISB package has been obtained by forming a multi-layer conductive pattern on a conductive foil functioning also as a supporting substrate to form a multi-layer interconnection structure, followed by further mounting circuit elements, further followed by molding with an insulating resin, still further followed by removing the conductive foil.

According to the package, advantages below can be obtained.

(i) Owing to coreless mounting, miniaturization and thinning of transistors, ICs and LSIs can be realized.

(ii) From transistors to system LSIs, and chip type capacitors and resistors form circuits, followed by packaging; accordingly, a higher degree of SiP (System in Package) can be realized.

(iii) Since it can be obtained by combining semiconductor chips in being, a system LSI can be developed in a short period.

(iv) Since a semiconductor bare chip is directly mounted on copper immediately therebelow, excellent heat dissipation properties can be obtained.

(v) Since a circuit interconnection is made of copper and there is no core material, a circuit interconnection can have a low dielectric constant and excellent characteristics can be exhibited in high-speed data transmission and high frequency circuits.

(vi) Since electrodes are embedded inside of a package, the particle contamination owing to an electrode material can be suppressed from occurring.

(vii) A package size can be freely selected. When waste material per one package is compared with that of a 64-pin SQFP package, it is substantially one tenth; accordingly, the environmental burden can be lowered.

(viii) From a printed circuit board on which components are mounted to a printed circuit board that incorporates functions, a new conception of system configuration can be realized.

(ix) In the ISB, pattern designing can be carried out easily same as in pattern designing of a printed circuit board; accordingly, an engineer of a set maker can design by himself.

When a manufacturing method of a semiconductor module in the present embodiment is applied in the manufacture of an ISB package, since a surface of an embedding member that partially or wholly constitutes a circuit element is flat and one surface at an upper portion of a layered film and one surface at an upper portion of the embedding member are formed so as to be a flat surface, a surface of a film formed further thereabove also becomes flat. Furthermore, a high processing accuracy can be obtained by introducing the photoimageable solder resist layer 220 containing the cardo type polymer. Accordingly, the manufacturing cost or manufacturing stability of the ISB packages can be improved, or the high-speed signal transmission can be realized.

Furthermore, according to the embodiment, an insulating resin film itself with which circuit elements are sealed can be functioned as a supporting substrate; accordingly, trouble of removing a substrate after a multi-layer interconnection structure is formed can be saved. Thereby, a manufacturing process of an ISB package can be simplified and the above-mentioned advantages can be obtained.

Therefore, according to the embodiment, a multi-chip SiP utilizing the wafer processing, the ISB technology and the apparatus can be realized. And a bump-less structure can be realized; accordingly, high-speed signal transmission and a thinner package can be realized. Furthermore, the photoimageable solder resist layer 220 containing the cardo type polymer allows a high-density interconnection in outer layer; accordingly, a package corresponding to miniaturization and many pin-ization can be realized. Additionally, a passive element can be incorporated inside of a circuit device so that a thin and high-performance SiP can be provided.

In the above, the present invention is explained based on embodiments and examples. It is easily understood by ones skilled in the art that the embodiments and examples are only for exemplification, various modifications can be applied-and such modifications are also included in the range of the invention.

For instance, an interlayer electrical connection in an interconnection layer can be obtained via a wire and the like, without restricting to a method where a throughhole is embedded with a conductive material. In this case, the wire may be covered with a sealing material.

The interconnection 125, the conductive film 124, the high dielectric constant member 170, and the resistor 180 may be formed beforehand by film formation using CVD method or sputtering method, patterning, etching and so on, followed by formation of the layered film 160. In this case, the cardo type polymer contained photoimageable solder resist layer 220 is formed after formation of the layered film 160. The process following it and reaching interconnection formation may be performed as mentioned above.

As shown in FIGS. 2A through 2E and FIGS. 3F through 3K, the circuit element may be as well so as to include that consisted of the first element and the second element thereon. As the combination of the first and the second elements, for instance, an SRAM and a flash memory, or an SRAM and a PRAM can be combined. In this case, the first and the second elements can be electrically connected each other through a via hole.

Furthermore, a material of the layered film 160, without restricting to an insulating resin film, may be a carbon material that becomes a material of a resistor, or a high dielectric constant material that becomes a constituent member of a capacitor. In this case, the embedding material that is embedded in the recess 190 of the layered film 160 may be an insulating resin material.

Furthermore, as a treatment of the embedding material for forming the embedding member that partially or wholly constitutes circuit elements such as a capacitor and a resistor, without restricting to the drying, various processing such as sintering, pressure bonding, compression, solidifying, coagulation, molding, cross-linking, curing, denaturing and so on can be performed depending on the characteristics of the target embedding material.

What is claimed is:

1. A semiconductor module comprising:
an insulating resin film;
a plurality of circuit elements embedded in the insulating resin film;
a solder resist layer which is provided above the insulating resin film and constitutes an outermost dielectric layer of the semiconductor module; and
on the solder resist layer, a structure of a conductive film and a solder electrode, and wherein
the plurality of circuit elements are bonded to the insulating resin film, the solder resist layer contains a cardo type polymer, and the solder resist layer is positioned between that structure and the insulating resin film.

2. The semiconductor module according to claim 1, wherein
an upper surface of a first part of one of the circuit elements and an upper surface of an insulating film between the circuit elements extend in a first plane; and
a lower surface of the first part or of a second part of the one of the circuit elements and a lower surface of the insulating film between the circuit elements extend in a second plane.

3. The semiconductor module according to claim 1, wherein
an interconnection which connects the circuit elements is provided in the solder resist layer.

4. The semiconductor module according to claim 2, wherein
an interconnection which connects the circuit elements is provided in the solder resist layer.

5. The semiconductor module according to claim 1, wherein
a glass transition temperature of the solder resist layer ranges from 180° C. to 220° C., and
a dielectric dissipation factor of the solder resist layer ranges from 0.001 to 0.04 when an alternating electric field having a frequency of 1 MHz is applied to the solder resist layer.

6. The semiconductor module according to claim 5, wherein
a linear expansion coefficient of the solder resist layer ranges from 50 ppm/° C. to 80 ppm/° C. in a range not more than the glass transition temperature of the solder resist layer.

7. The semiconductor module according to claim 5, wherein
a heat conductivity of the solder resist layer ranges from 0.10 W/cm$^2$·sec to 0.50 W/cm$^2$·sec.

8. The semiconductor module according to claim 5, wherein
a via hole provided in an interconnection in the solder resist layer, which has a diameter ranging from 10 μm to 100 μm, has an aspect ratio of depth-to-width ranging from 0.5 to 5.

9. The semiconductor module according to claim 5, wherein
a dielectric constant of the solder resist layer ranges from 0.1 to 4.0 when an alternating electric field having a frequency of 1 MHz is applied to the solder resist layer.

10. The semiconductor module according to claim 5, wherein
a 24-hour water absorption of the solder resist layer ranges from 0.5 wt % to 3.0 wt %.

11. A semiconductor module comprising:
an insulating resin film including a layer structure of a first insulating resin film and a second insulating resin film provided on the first insulating resin film;
a plurality of circuit elements embedded in and bonded to the first insulating resin film;
a solder resist layer, provided above the second insulating resin film, which constitutes an outermost dielectric layer of the semiconductor module and contains a cardo type polymer; and wherein
a structure of a conductive film and a solder electrode is provided on the solder resist layer such that the solder resist layer is positioned between that structure and the insulating resin film and
an amount of packing material in the first insulating resin film is smaller than an amount of packing material in the second insulating resin film.

* * * * *